United States Patent
Huang

(10) Patent No.: US 9,548,728 B2
(45) Date of Patent: Jan. 17, 2017

(54) TIME SIGNAL GENERATING CIRCUIT AND TIME SIGNAL GENERATING METHOD

(71) Applicant: uPI Semiconductor Corp., Hsinchu County (TW)

(72) Inventor: Kun-Min Huang, Hsinchu County (TW)

(73) Assignee: uPI Semiconductor Corp, Hsinchu County (TW)

( * ) Notice: Subject to any disclaimer, the term of this patent is extended or adjusted under 35 U.S.C. 154(b) by 0 days.

(21) Appl. No.: 14/788,812

(22) Filed: Jul. 1, 2015

(65) Prior Publication Data
US 2016/0277016 A1    Sep. 22, 2016

(30) Foreign Application Priority Data
Mar. 19, 2015    (TW) .............................. 104108797 A

(51) Int. Cl.
*H03K 3/017*    (2006.01)
*H03K 7/08*    (2006.01)

(52) U.S. Cl.
CPC ...................................... *H03K 7/08* (2013.01)

(58) Field of Classification Search
USPC .................. 327/172–175; 323/265, 283, 287
See application file for complete search history.

(56) References Cited

U.S. PATENT DOCUMENTS

| | | | |
|---|---|---|---|
| 7,872,458 B2 * | 1/2011 | Ishii | ...................... H02M 3/156 323/271 |
| 8,760,137 B2 | 6/2014 | Nishida et al. | |
| 2013/0249524 A1 | 9/2013 | Kujala et al. | |
| 2014/0077784 A1 | 3/2014 | Shen | |
| 2014/0232367 A1 | 8/2014 | Kuo et al. | |

* cited by examiner

*Primary Examiner* — An Luu
(74) *Attorney, Agent, or Firm* — Jianq Chyun IP Office

(57) ABSTRACT

A time signal generating circuit and a time signal generating method are provided. The time signal generating method includes following steps: receiving a feedback voltage and a reference voltage to provide a first control signal, wherein the feedback voltage is related to an output voltage of a power converter; receiving an input voltage and a default voltage to provide a second control signal; and adjusting an on-time of a pulse width modulation signal according to the first control signal and the second control signal.

8 Claims, 5 Drawing Sheets

4

TIME SIGNAL GENERATING CIRCUIT AND TIME SIGNAL GENERATING METHOD

CROSS-REFERENCE TO RELATED APPLICATION

This application claims the priority benefit of Taiwan application serial no. 104108797, filed on Mar. 19, 2015. The entirety of the above-mentioned patent application is hereby incorporated by reference herein and made a part of this specification.

BACKGROUND OF THE INVENTION

Field of the Invention

The invention relates to a time signal generating technique of a power converter, more specifically, to a time signal generating circuit having an on-time that is regulated correspondingly to an input voltage and a time signal generating method using the same.

Description of Related Art

Generally, to generate successfully an expected output voltage of a DC to DC converter, an input voltage of the DC to DC converter needs being higher, to certain extent, than the expected output voltage. In a condition that the input voltage is provided by a battery, the input voltage will decrease gradually over time so that the output voltage generated by the DC to DC converter could not reach the expected and rated voltage value.

FIG. 1 is a schematic diagram of a circuit architecture of a conventional DC to DC converter. Referring to FIG. 1, when a pulse width modulation (PWM) is at constant on-time (COT), a comparing unit 10 of the DC to DC converter 1 compares a feedback voltage VFB, which relates to the output voltage VOUT, with a reference voltage VREF. In case the comparing unit 10 attains a result that the feedback voltage VFB is lower than the reference voltage VREF, the result is represented as the output voltage VOUT generated by the DC to DC converter 1 becomes obviously low. Therefore, a pulse width modulation unit 12 sends a fixed on-time pulse width modulation signal PWM to an output stage 14 so that a capacitor C is performed charging, and the phenomenon that the output voltage VOUT couldn't reach the rated voltage value increases.

FIG. 2 is a timing diagram of the input voltage, the output voltage and the pulse width modulation signal of the conventional DC to DC converter. Referring to FIG. 2, every on-time Ton of the pulse width modulation signal PWM is accompanied and followed by an off-time Toff. In addition, a cycle time of the pulse width modulation signal PWM is defined as an on-time Ton and an off-time Toff. Before the time TA, the value of the input voltage VIN is stable and fixed, the on-time Ton and the off-time Toff all have a fixed value and appear repeatedly. In the situation that the cycle time of the pulse width modulation signal PWM doesn't change, the input voltage VIN starts to decrease after the time TA so that the on-time Ton increases and the off-time Toff decreases correspondingly. Hence, the output voltage VOUT is maintained at the rated voltage and the output voltage VOUT couldn't be decreased. When the input voltage VIN decreases to a certain extent (the default voltage VTH) after the time TB, the cycle time of the pulse width modulation signal PWM is maintained constant and the off-time Toff of the cycle time couldn't further decrease so that the on-time Ton is also maintained at a fixed value and a longer charging time couldn't be provided. As a result, the output voltage VOUT decreases correspondingly to the decreasing of the input voltage VIN, more importantly, the voltage conversion efficiency of the DC to DC converter 1 (as shown in FIG. 1) is affected.

FIG. 3 is a schematic diagram of a transient response of the conventional DC to DC converter. Referring to FIG. 3, a loading condition occurs at the time TA (for example, load current ILoad), the inductive current IL and the output voltage VOUT oscillate according to the loading. After the time TB, the input voltage VIN is smaller than the default voltage VTH (as shown in FIG. 2), the transient response of the inductive current IL and the output voltage VOUT oscillates much more intensely.

SUMMARY OF THE INVENTION

In this view, the invention proposes a time signal generating circuit that is applied for a power converter and a time signal generating method to solve the problems of the prior art.

The invention provides the time signal generating circuit that includes a first transduction unit, a second transduction unit and a time calculation unit. The first transduction unit receives a feedback voltage and a reference voltage to provide a first control signal, wherein the feedback voltage is related to an output voltage of a power converter. The second transduction unit is coupled to the first transduction unit and receives an input voltage and a default voltage to provide a second control signal. The time calculation unit is coupled to the second transduction unit and adjusts an on-time of a pulse width modulation signal according to the first control signal and the second control signal.

In one embodiment of the invention, when or only when the input voltage is lower than the default voltage, the time calculation unit adjusts the on-time according to the first control signal and the second control signal.

In one embodiment of the invention, when or only when the feedback voltage is not lower than the reference voltage, the value of the first control signal is zero, the second control signal is an information having a fixed gain value and the time calculation unit increases the on-time according to the information having the fixed gain value.

In one embodiment of the invention, when or only when the feedback voltage is lower than the reference voltage, the value of the first control signal is non-zero and the second control signal is an information having a dynamic gain value, and the time calculation unit increases the on-time according to the information having the dynamic gain value.

In addition, the invention provides a time signal generating method. The time signal generating method includes following steps: (A) Receiving a feedback voltage and a reference voltage to provide a first control signal, wherein the feedback voltage is related to an output voltage of a power converter; (B) Receiving an input voltage and a default voltage to provide a second control signal; and (C) Adjusting an on-time of a pulse width modulation signal according to the first control signal and the second control signal.

In one embodiment of the invention, when or only when the input voltage is lower than the default voltage, executing the step (C) to adjust the on-time.

In one embodiment of the invention, when or only when the feedback voltage is not lower than the reference voltage, the value of the first control signal is zero, the second control signal is an info nation having a fixed gain value and the on-time is increased according to the information having the fixed gain value.

In one embodiment of the invention, when or only when the feedback voltage is lower than the reference voltage, the value of the first control signal is non-zero and the second control signal is an information having a dynamic gain value, and the on-time is adjusted according to the information having the dynamic gain value.

In summary, the time signal generating circuit and the time signal generating method of the invention solve the problems that the input voltage changes over time (especially, the decreasing of the input voltage), the output voltage is in a transient state, and the rated output voltage couldn't be effectively provided. The calculating on-time system of this application is performed according to the two differences, one is the difference of the input voltage and the default voltage (the second control signal), the other one is the difference of the feedback voltage and the reference voltage (the first control signal). Wherein, the first control signal affects the gain value of the second control signal. As a result, in the application, when or only when the input voltage of the power converter is lower than the default voltage, the information having dynamic gain value could be provided when only when the output voltage is in loading condition, the information having fixed value could be provided when only when the output voltage is in unloading condition.

It should be noted that the above described general descriptions and following embodiments are only taken as examples and used for illustrating, not for limiting the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
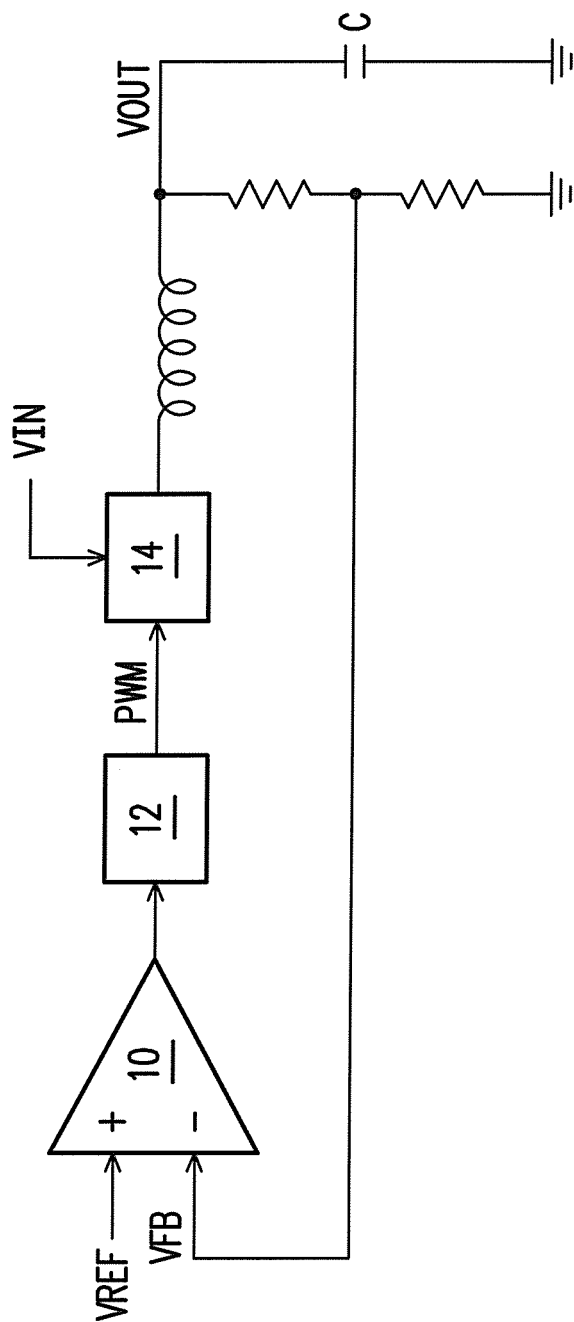
FIG. 1 is a schematic diagram of a circuit architecture of a conventional DC to DC converter.

Reference will now be made in detail to the present preferred embodiments of the invention, examples of which are illustrated in the accompanying drawings.

Wherever possible, the same reference numbers are used in the drawings and the description to refer to the same or like parts.

In the following embodiments, when a device is described to be "connected" or "coupled" to another device, it is interpreted as that the device is directly connected to or coupled to the other device, or the device is indirectly connected to or coupled to the other device through other devices or connection means. A term "circuit" or "unit" represents at least one device or a plurality of devices, or devices actively and/or passively coupled to each other to provide a suitable function. A term "signal" represents at least one current, voltage, load, temperature, data or other signal. It should be noticed that a physical property of the signals referred throughout the descriptions and figures can be voltage or current.

Figure 4:
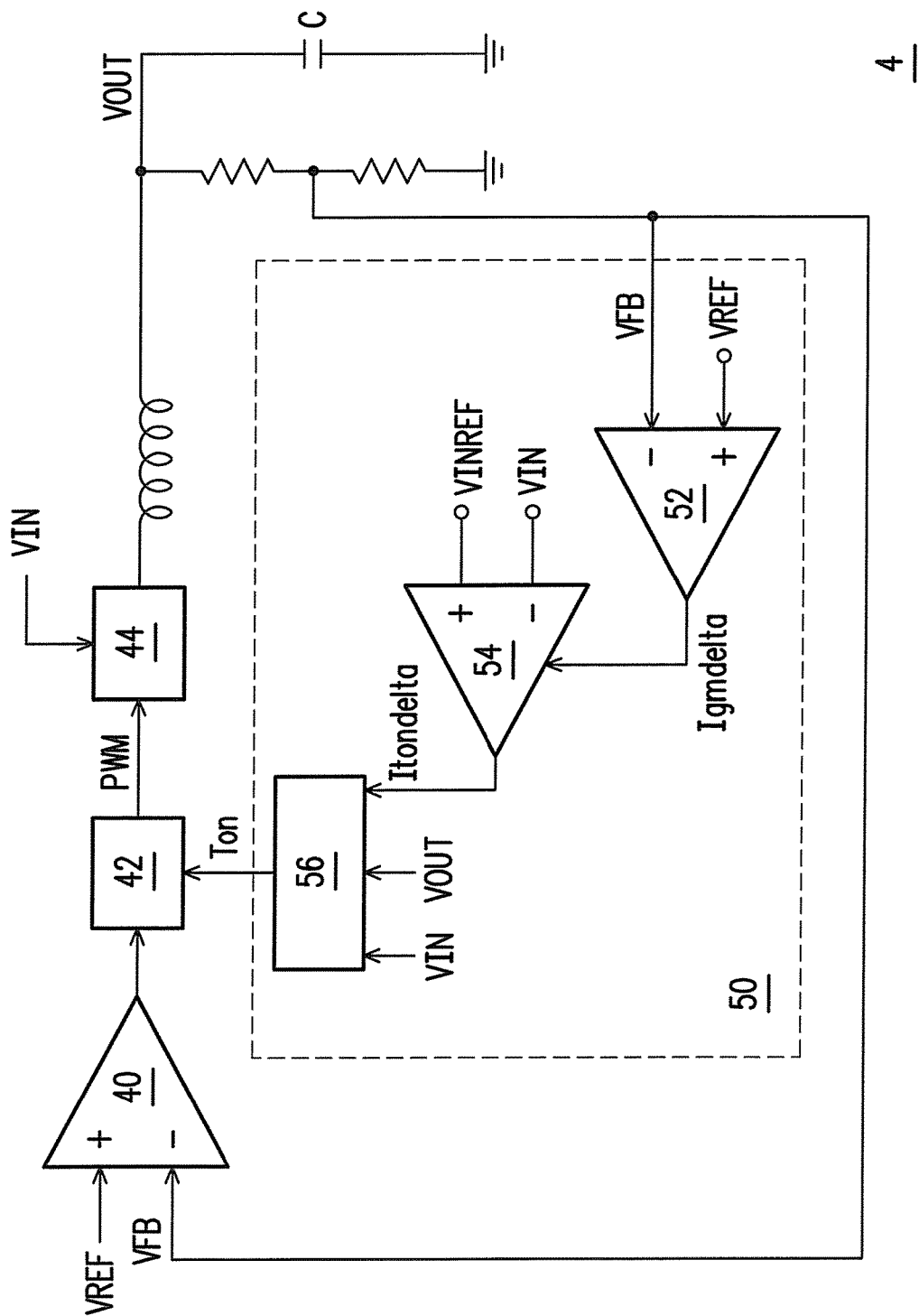
FIG. 4 is a circuit diagram of a power converter according to one embodiment of the invention.

FIG. 4 is a circuit diagram of a power converter according to one embodiment of the invention. Referring to FIG. 4. The invention provides a time signal generating circuit 50 which is applied to a power converter 4, but the invention is not limited thereto. The invention could be adapted for a constant on-time (COT) DC to DC converter. The power converter 4 includes a comparing unit 40, a driving unit 42, an output stage 44 and a time signal generating circuit 50. The driving unit 42 could include a pulse width modulation controller. The output stage 44 could include a high side switch and a low side switch. The time signal generating circuit 50 is coupled to the comparing unit 40 and the driving unit 42.

The time signal generating circuit 50 includes a first transduction unit 52, a second transduction unit 54 and a time calculation unit 56. The first transduction unit 52 receives a feedback voltage VFB and a reference voltage VREF to provide a first control signal Igmdelta. The feedback voltage VFB is related to an output voltage VOUT of the power converter 4. For example, the feedback voltage VFB is the product of a multiplication of a scale factor K1 and the output voltage VOUT. The second transduction unit 54 is coupled to the first transduction unit 52 and the time calculation unit 56. The second transduction unit 54 receives an input voltage VIN and a default voltage VINREF to provide a second control signal Itondelta for the time calculation unit 56. The time calculation unit 56 adjusts an on-time Ton of a pulse width modulation signal PWM according to the first control signal Igmdelta and the second control signal Itondelta. In this embodiment, the first transduction unit 52 and the second transduction unit 54 could include a transduction amplifier.

Figure 2:
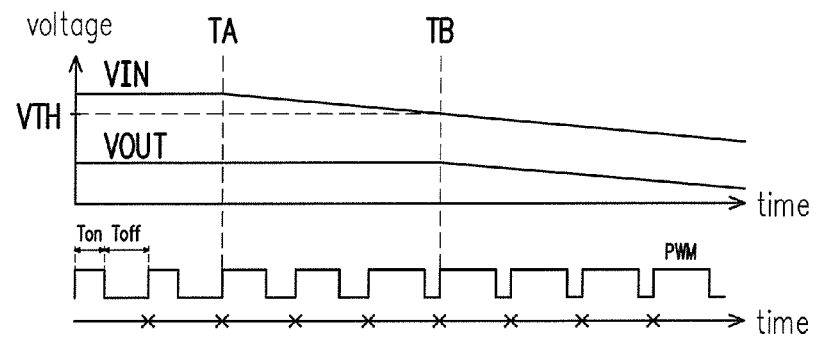
FIG. 2 is a timing diagram of the input voltage, the output voltage and the pulse width modulation signal of the conventional DC to DC converter.
Figure 3:
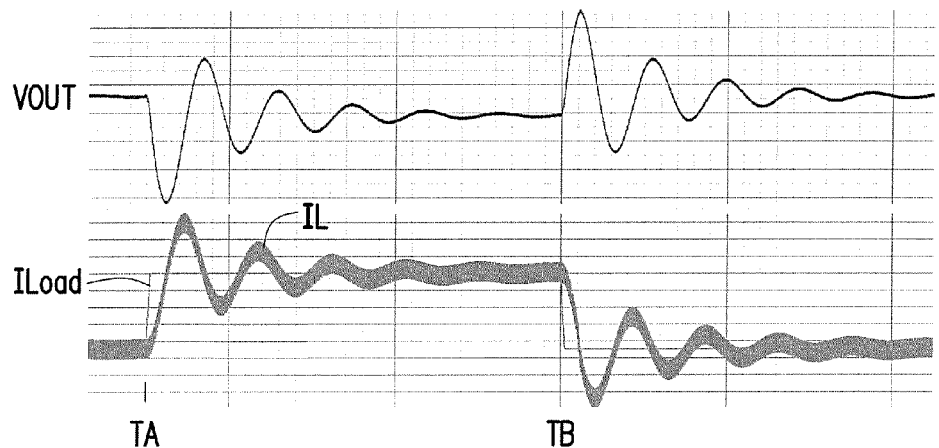
FIG. 3 is a schematic diagram of a transient response of the conventional DC to DC converter.

The default voltage VINREF and the reference voltage VREF could be configured to be greater than the breakdown voltage value of the input voltage VIN, the breakdown voltage value is the default voltage VTH as shown in FIG. 2. The time signal generating circuit 50 uses the unidirectional second transduction unit 54 to detect the change of the input voltage VIN, and uses the unidirectional first transduction unit 52 to detect the change of the output voltage VOUT. When or only when the input voltage VIN is lower than the default voltage VINREF, the time calculation unit 56 starts to adjust the on-time Ton.

When or only when the first transduction unit 52 couldn't detect that the feedback voltage VFB is lower than the reference voltage VREF, the output voltage VOUT doesn't have LC oscillation situation, and the value of the first control signal Igmdelta provided by the first transduction unit 52 is zero. The second transduction unit 54 is not affected by the zero value. The output information converted by the second transduction unit 54 is (VINREF−VIN)×gm1. The second control signal Itondelta is an information having a fixed gain value, the information is (VINREF−VIN)×gm1. In other words, in the situation that the input voltage VIN decreases and the output voltage VOUT doesn't have the transient response, the time calculation unit 56 increases the on-time Ton according to the information having the fixed gain value.

In the loading condition, when or only when the first transduction unit 52 could detect that the feedback voltage VFB is lower than the reference voltage VREF, the output voltage VOUT has LC oscillation situation, the value of the first control signal Igmdelta provided by the first transduction unit 52 is non-zero. The second transduction unit 54 is affected by the non-zero value. The output info nation converted by the second transduction unit 54 receives the change of the first control signal Igmdelta. The second control signal Itondelta is an information having a dynamic gain value. In other words, in the situation that the input voltage VIN decreases and the output voltage VOUT has the transient response, the time calculation unit 56 adjusts the on-time Ton according to the information having the dynamic gain value. As a result, the time signal generating circuit 50 could regulate the on-time Ton transiently.

Figure 5:
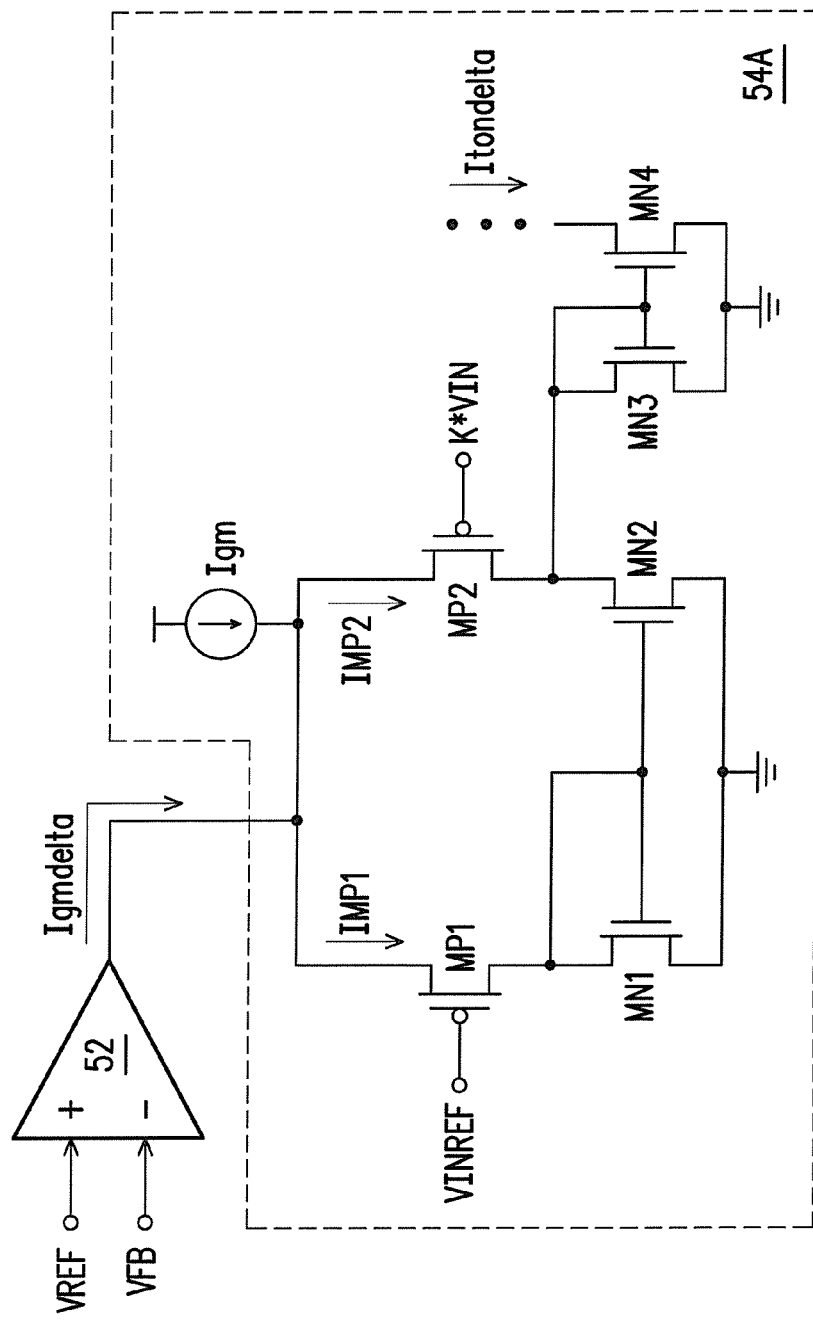
FIG. 5 is a circuit diagram of a time signal generating circuit according to one embodiment of the invention.

FIG. 5 is a circuit diagram of a time signal generating circuit according to one embodiment of the invention. Referring to FIG. 4 and FIG. 5. The time signal generating circuit 50A includes the first transduction unit 52, the second transduction unit 54A and the time calculation unit 56. A current source Igm is a constant current source. When or only when the value of the first control signal Igmdelta is zero, the sum of the current IMP1 which flows through the transistor MP1 and the current IMP2 which flows through the transistor MP2 is equal to the current source Igm. When or only when the product of a multiplication of K and the input voltage VIN is lower than the default voltageVINREF, the current IMP2 is greater than the current IMP1, the current IMP1 flows through a current mirror which is formed by the two transistors MN1 and MN2. A current IMP2−IMP1 which is calculated by the transistors MP2 and MN2 flows to another current mirror. The current IMP2−IMP1 flows to a current mirror that is formed by the transistors MN3 and MN4, and the second control signal Itondelta is generated at the drain-source of the transistor MN4. The time calculation unit 56 adjusts the on-time Ton according to the second control signal Itondelta.

In another embodiment, when or only when the output voltage is in the loading condition and the feedback voltage VFB is lower than the reference voltage VREF, the value of the first control signal Igmdelta provided by the first transduction unit 52 is non-zero. The sum of the current IMP1 and the current IMP2 is equal to Igm+Igmdelta so that the first control signal Igmdelta affects the second transduction unit 54A and affects the value of the second control signal Itondelta calculated by the difference of the multiplication K*VIN and the default voltage VINREF. As a result, the time calculation unit 56 could increase the on-time Ton by the corresponding transient response.

Figure 6:
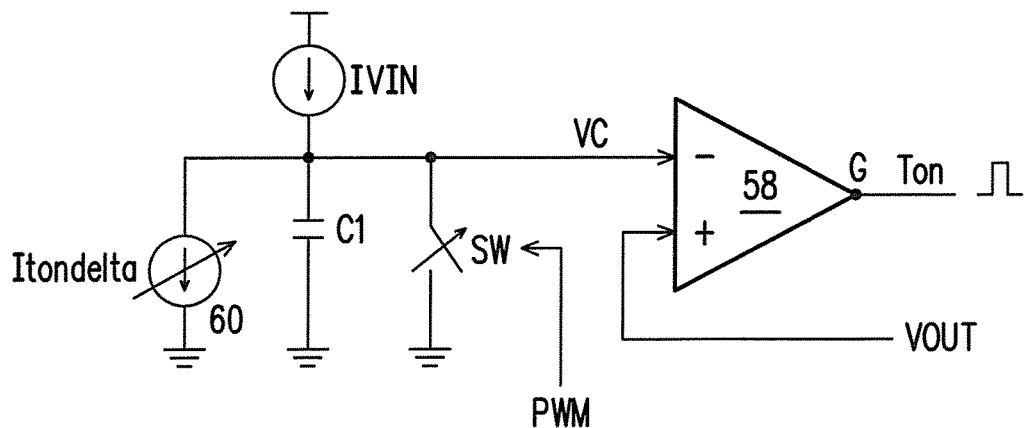
FIG. 6 is a circuit diagram of a time calculation unit according to one embodiment of the invention.

FIG. 6 is a circuit diagram of a time calculation unit according to one embodiment of the invention. Referring to FIG. 4 and FIG. 6. The time calculation unit 56 includes a capacitor C1, a switch SW, a comparator 58, a current source IVIN related to the input voltage VIN, and an adjustable constant current source 60 related to the second control signal Itondelta. Wherein the first control signal Igmdelta could affect the second control signal Itondelta.

The capacitor C1 is coupled between the current source IVIN and the ground terminal. The two terminals of the switch SW connect to the two terminals of the capacitor C1. The adjustable constant current source 60 connects to the two terminals of the capacitor C1. The negative input terminal (−) of the comparator 58 is coupled in between the current source IVIN and the capacitor C1. The positive input terminal (+) of the comparator 58 is coupled to the output voltage VOUT. The output terminal G of the comparator 58 sends the on-time Ton out.

Because the current generated by the adjustable constant current source 60 could become smaller or greater, the current generated by the current source IVIN could charge the capacitor C1 in a shorter or in a longer time. Therefore, the equal electric level time of the negative input terminal, which receives the attained capacitor voltage VC, and the positive input terminal, which receives the output voltage VOUT, of the comparator 58 become longer or shorter so that the on-time Ton of the pulse width modulation signal PWM could be lengthened or be shortened.

Figure 7:
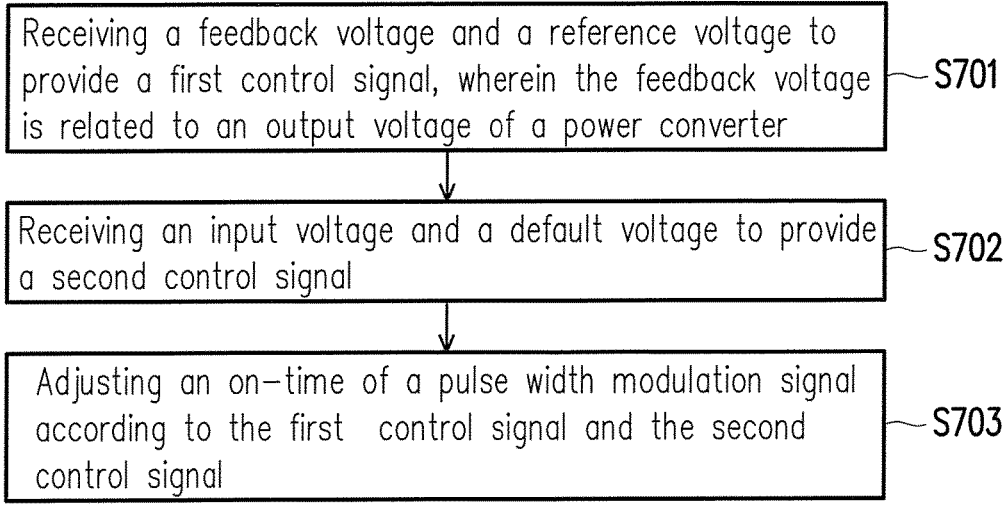
FIG. 7 is a flow diagram of a time signal generating method of the power converter according to one embodiment of the invention.

According to the above descriptions, a general time signal generating method of a power converter is deduced. To be more specific, FIG. 7 is a flow diagram of a time signal generating method of the power converter according to one embodiment of the invention. Referring to FIGS. 4-7, the time signal generating method in this embodiment includes following steps:

As shown in step S701: receiving a feedback voltage VFB and a reference voltage VREF to provide a first control signal Igmdelta, wherein the feedback voltage VFB is related to an output voltage VOUT of a power converter 4.

As shown in step S702: receiving an input voltage VIN and a default voltage VINREF to provide a second control signal Itondelta.

As shown in step S703: adjusting an on-time Ton of a pulse width modulation signal PWM according to the first control signal Igmdelta and the second control signal Itondelta.

When or only when the input voltage VIN is lower than the default voltage VINREF, the step S703 is executed to adjust the on-time Ton.

When or only when the feedback voltage VFB is not lower than the reference voltage VREF, the value of the first control signal Igmdelta is zero, the second control signal Itondelta is an information having a fixed gain value and the on-time Ton is increased according to the information having the fixed gain value.

When or only when the feedback voltage is lower than the reference voltage, the value of the first control signal Igmdelta is non-zero and the second control signal Itondelta is an information having a dynamic gain value, and the on-time Ton is adjusted according to the information having the dynamic gain value.

In summary, the time signal generating circuit and the time signal generating method of the invention solve the problems that the input voltage changes over time (especially, the decreasing of the input voltage), the output voltage is in a transient state, and the rated output voltage couldn't be effectively provided. The calculating on-time system of this application is performed according to the two differences, one is the difference of the input voltage and the default voltage (the second control signal), the other one is the difference of the feedback voltage and the reference voltage (the first control signal). Wherein, the first control signal could affect the gain value of the second control signal. As a result, in the application, when or only when the input voltage of the power converter is lower than the default voltage, the information having dynamic gain value could be provided when only when the output voltage is in loading condition, the information having fixed value could be provided when only when the output voltage is in unloading condition.

Although the invention has been disclosed with reference to the aforesaid embodiments, they are not intended to limit the invention. It will be apparent to one of ordinary skill in the art that modifications and variations to the described embodiments may be made without departing from the spirit and the scope of the invention. Accordingly, the scope of the invention will be defined by the attached claims and not by the above detailed descriptions.

In view of the foregoing, it is intended that the invention cover modifications and variations of this invention provided they fall within the scope of the following claims and their equivalents. Moreover, no element and component in the present disclosure is intended to be dedicated to the public regardless of whether the element or component is explicitly recited in the following claims.

What is claimed is:

1. A time signal generating circuit, comprising:
   a first transduction unit, receiving a feedback voltage and a reference voltage to provide a first control signal, wherein the feedback voltage is related to an output voltage of a power converter;
   a second transduction unit, coupled to the first transduction unit, and receiving an input voltage of the power converter and a default voltage to provide a second control signal; and
   a time calculation unit, coupled to the second transduction unit, and adjusting an on-time of a pulse width modulation signal according to the first control signal and the second control signal.

2. The time signal generating circuit as recited in claim 1, wherein when the input voltage is lower than the default voltage, the time calculation unit adjusts the on-time according to the first control signal and the second control signal.

3. The time signal generating circuit as recited in claim 1, wherein when the feedback voltage is not lower than the reference voltage, the value of the first control signal is zero, the second control signal is an information having a fixed gain value and the time calculation unit increases the on-time according to the information having the fixed gain value.

4. The time signal generating circuit as recited in claim 1, wherein when the feedback voltage is lower than the reference voltage, the value of the first control signal is non-zero and the second control signal is an information having a dynamic gain value, and the time calculation unit adjusts the on-time according to the information having the dynamic gain value.

5. A time signal generating method, comprising:
   step (A) receiving a feedback voltage and a reference voltage to provide a first control signal, wherein the feedback voltage is related to an output voltage of a power converter;
   step (B) receiving an input voltage of the power converter and a default voltage to provide a second control signal; and
   step (C) adjusting an on-time of a pulse width modulation signal according to the first control signal and the second control signal.

6. The time signal generating method as recited in claim 5, further comprising:
   executing the step (C) to adjust the on-time when the input voltage is lower than the default voltage.

7. The time signal generating method as recited in claim 5, further comprising:
   the value of the first control signal being zero, the second control signal being an information having a fixed gain value, and the on-time being increased according to the information having the fixed gain value when the feedback voltage is not lower than the reference voltage.

8. The time signal generating method as recited in claim 5, further comprising:
   the value of the first control signal being non-zero, the second control signal being an information having a dynamic gain value, and the on-time being adjusted according to the information having the dynamic gain value when the feedback voltage is lower than the reference voltage.

* * * * *